United States Patent
Conrad et al.

(10) Patent No.: US 6,694,498 B2
(45) Date of Patent: Feb. 17, 2004

(54) FEED-FORWARD LITHOGRAPHIC OVERLAY OFFSET METHOD AND SYSTEM

(75) Inventors: Edward W. Conrad, Jeffersonville, VT (US); Charles J. Parrish, Milton, VT (US); Charles A. Whiting, Milton, VT (US)

(73) Assignee: Internationl Business Machines Corporation, Armonk, NY (US)

( * ) Notice: Subject to any disclaimer, the term of this patent is extended or adjusted under 35 U.S.C. 154(b) by 97 days.

(21) Appl. No.: 10/016,552

(22) Filed: Dec. 13, 2001

(65) Prior Publication Data

US 2003/0115556 A1 Jun. 19, 2003

(51) Int. Cl.$^7$ .............................................. G06F 17/50
(52) U.S. Cl. ............................. 716/4; 716/19; 716/20; 716/21
(58) Field of Search .......................... 716/1–4, 19, 20, 716/21

(56) References Cited

U.S. PATENT DOCUMENTS

| | | | |
|---|---|---|---|
| 4,929,083 A | * 5/1990 | Brunner | 356/400 |
| 5,355,306 A | * 10/1994 | Waldo, III | 700/59 |
| 5,444,538 A | 8/1995 | Pellegrini | 356/401 |
| 5,468,580 A | 11/1995 | Tanaka | 430/22 |
| 5,498,500 A | 3/1996 | Bae | 430/22 |
| 5,521,036 A | 5/1996 | Iwamoto et al. | 430/22 |
| 5,561,606 A | 10/1996 | Ota et al. | 716/19 |
| 5,699,282 A | 12/1997 | Allen et al. | 702/85 |
| 5,773,180 A | 6/1998 | Tomimatu | 430/22 |
| 5,831,739 A | 11/1998 | Ota | 356/401 |
| 5,923,041 A | 7/1999 | Cresswell et al. | 356/401 |
| 5,993,043 A | 11/1999 | Fujii | 700/121 |
| 6,061,606 A | 5/2000 | Ross | 700/121 |
| 6,456,953 B1 | * 9/2002 | Peruffo et al. | 702/94 |

* cited by examiner

*Primary Examiner*—Matthew Smith
*Assistant Examiner*—Sun James Lin
(74) *Attorney, Agent, or Firm*—Scully, Scott, Murphy & Presser; William D. Sabo, Esq.

(57) ABSTRACT

A method and system embodying the present invention for predicting systematic overlay affects in semiconductor lithography. This method is a feed-forward method, based on correlation of current and prior aligned levels, to predict optimum overlay offsets for a given lot. Instead of using population averaging, which ignores process variability, it acknowledges the variability and uses prior measurements to advantage. The principle, backed by production data, is that "systematic" overlay errors are just that: Image placement errors which persist through processing and will be predictable through time and processing.

20 Claims, 3 Drawing Sheets

---

METHOD OF PREDICTING SYSTEMATIC
LITHOGRAPHIC OVERLAY OFFSETS

CREATING A DATABASE OF OVERLAY SYSTEMATICS FOR EACH LOT PROCESSED AT A FIRST LITHOGRAPHIC LEVEL AND SECOND LITHOGRAPHIC LEVEL BY MEASURING OVERLAY, AND RECORDING THESE SYSTEMATIC ERRORS AND THE LOT IDENTIFICATION

↓

CREATING A CORREALATION BETWEEN EACH OVERLAY OFFSET AT THE SECOND LITHOGRAPHIC LEVEL RELATIVE TO THE FIRST LITHOGRAPHIC LEVEL

↓

FOR A NEW LOT, MEASURING THE OVERLAY SYSTEMATICS AT THE FIRST LITHOGRAPHIC LEVEL

↓

USING THE CORRELATION BETWEEN THE OVERLAY OFFSETS, AND THE DATA FROM THE FIRST LITHOGRAPHIC LEVEL, TO PREDICT THE OPTIMUM OVERLAY OFFSETS AT THE SECOND LITHOGRAPHIC LEVEL

| | Absolute error, Feed-forward values | | | | Absolute error, Population average predicted | | | |
|---|---|---|---|---|---|---|---|---|
| Lot ID | PC ROT | PC MAG | PC XMA | PC SKE | PC ROT | PC MAG | PC XMA | PC SKE |
| PGU380897H | 0.038 | 0.350 | 0.424 | 0.017 | 2.83 | 0.30 | 0.10 | 0.01 |
| PGU380987H | 1.080 | 0.088 | 0.199 | 0.724 | 1.44 | 0.10 | 0.01 | 0.26 |
| PGU381027H | 0.592 | 0.074 | 0.584 | 0.068 | 0.99 | 0.27 | 0.31 | 0.13 |
| PGU381047H | 1.201 | 0.046 | 0.131 | 0.107 | 1.38 | 0.15 | 0.00 | 0.35 |
| PGU370267H | 0.460 | 0.681 | 0.467 | 0.320 | 2.81 | 0.71 | 0.69 | 0.08 |
| Average error | 0.674 | 0.248 | 0.361 | 0.247 | 1.889 | 0.303 | 0.223 | 0.165 |
| Stdev error | 0.474 | 0.271 | 0.190 | 0.290 | 0.866 | 0.239 | 0.290 | 0.139 |

| | Absolute error, Modeled values | | Absolute error, Population average values | |
|---|---|---|---|---|
| Lot ID | PC ROT | PC SKEW | PC ROT | PC SKEW |
| UYU34J09BW | 0.04 | 0.51 | 0.04 | 0.31 |
| UYU37000BW | 0.37 | 0.09 | 1.53 | 1.33 |
| UYU36021BW | 0.60 | 0.31 | 1.78 | 1.07 |
| UYU36006BW | 0.48 | 0.24 | 2.73 | 0.24 |
| UYU36018BW | 0.06 | 0.55 | 1.47 | 1.34 |
| UYU37001BW | 0.69 | 0.18 | 0.71 | 0.54 |
| Average error | 0.38 | 0.31 | 1.38 | 0.80 |
| Stdev error | 0.243 | 0.174 | 0.726 | 0.493 |

FEED-FORWARD LITHOGRAPHIC OVERLAY OFFSET METHOD AND SYSTEM

BACKGROUND OF THE INVENTION

1. Field of the Invention

This invention generally relates to semiconductor lithography, and more specifically to addressing overlay errors that can occur in semiconductor lithography.

2. Prior Art

One of the most important requirements for semiconductor lithography is overlay, or image placement of one lithographic level relative to another. Overlay errors of one level relative to the prior level are often numerically broken down into systematic and non-systematic components; systematic components are typically: X and Y translation [zeroth order error]; and Lithographic field X and Y magnification, rotation, and skew [first order error across the wafer]

These zeroth and first-order components are chosen specifically because the errors are relatively easily correctable, and while there are repeatable higher-order effects, they are typically not easily fixable and are lumped in as "residual" errors. The correctable components are often referred to as overlay systematics, and are used to generate overlay offsets (settings) which are transferred to the aligner to achieve proper overlay.

To achieve good overlay, there are numerous approaches. For "easy" (loose overlay specification relative to aligner and process capability) levels, a fixed set of overlay offsets can be used with reasonable success. As specifications tighten, it is necessary to periodically update overlay offsets. One method of this update is to couple a database with a software data filtering means and averaging algorithm to automatically adjust these offsets. Because of either process/aligner variability or aligner shifts, an average of past offsets, no matter how well sorted, is not necessarily the optimum predictor of what a current lot needs for best overlay. In summary, the current state of the art uses feedback methods, based on population means, as a predictor for aligner settings.

The problem of optimized overlay is central to all semiconductor lithography fabrication. Existing methods for addressing this problem typically use population averaging to remove noise or slowly react to change.

SUMMARY OF THE INVENTION

An object of this invention is to improve overlay offset methods and systems for semiconductor lithography.

Another object of the present invention is to provide feed-forward methods, in semiconductor lithography procedures, based on correlation of current and prior aligned levels, to predict optimum overlay offsets for a given lot.

These and other objectives are attained with a method and system embodying the present invention for predicting systematic overlay affects in semiconcductor lithography. This method is a feed-forward method, based on correlation of current and prior aligned levels, to predict optimum overlay offsets for a given lot. Instead of using population averaging, which ignores process variability, it acknowledges the variability and uses prior measurements to advantage. The principle, backed by production data, is that "systematic" overlay errors are just that: Image placement errors which persist through processing and will be predictable through time and processing.

For example: If a first lithographic level is exposed and etched with a two microradian ($\mu$rad) rotation error, this is measurable after lithography. It is reasonable to expect (and has been experimentally proven) that this rotation error persists and is measurable at the second lithograpbic level. Although ideally this systematic distortion should measure two urad at the second level, measurement errors at either level, coupled with uncorrectable lithographic distortion, make a linear correlation with non-zero intercept likely. In addition, because of overlay calculation connections, the ideal slope for the correlation would be either +1 or −1.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
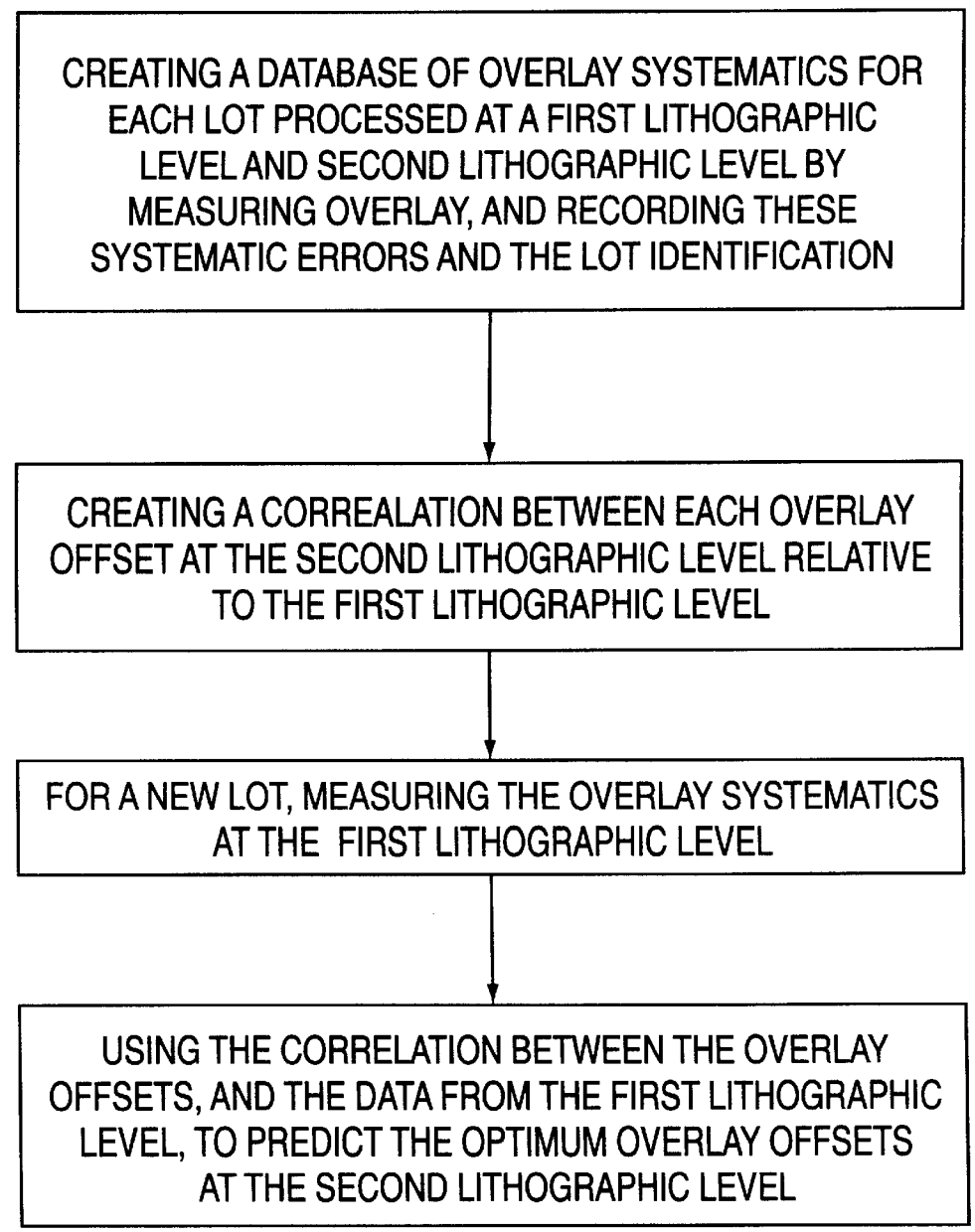
FIG. 1 outlines a preferred method embodying this invention.

The present invention, generally, provides for methods and systems of predicting systematic overlay effects in semiconductor lithography. With reference to FIG. 1, this, in a preferred embodiment, can be done by creating a database of overlay systematics for each lot processed at a first lithographic level and second lithographic level by measuring overlay, and recording these systematic errors and the lot identification. These systematic errors can be derived either for an unaligned level using known field-butting techniques; or for aligned levels, using conventional "box-in-box" structure measurements as already performed in the fabricator. The preferred method of this invention further comprises the steps of creating a correlation between each overlay offset at the second lithographic level relative to the first lithographic level; for a new lot, measuring the overlay systematics at the first lithographic level; and using the correlation between the overlay offsets, and the data from the first lithographic level, to predict the optimum overlay offsets at the second lithographic level.

This preferred embodiment may be enhanced in a number of ways. For instance, the correlation can be fine tuned by sorting according to various parameters, such as reticle, tool, lithographic level, and others. Also, the most straightforward and logical correlation would involve a linear relation, with simple linear regression techniques available. Optionally, the data can be statistically sorted to exclude outlying "flyers" (e.g. chi-squared test). Also, limits can be placed on the correlation coefficient, requiring a minimum r-squared value to utilize the correlation. As another option, limits can be placed on the intercept, requiring that it be within a certain offset of 0. If any limits are exceeded, then the algorithm to calculate overlay offsets would revert to the current population averaging techniques.

Optionally, if valid correlations exist on multiple align tools, the average of these correlations can be used to predict behavior on a new tool at the second lithographic level. As another option, if valid correlations exist for lithographic level 2 to level 1 on two tools; and a correlation exists for lithographic level 4 to level 3 on one of the tools, the difference between the two correlations on the first tool can be used to predict the correlation of level 4 to level 3 on the second tool.

The present invention does not ignore the population variability by averaging it; it acknowledges that variability is intrinsic to the process and takes advantage of it. The invention seeks to identify repeatable, predictable, sustainable variation in the process and uses it to feed predictable change forward to the next lithographic level. Population averaging treats all variability as unrepeatable noise, thus in essence discarding valuable, usable data.

Figures 2, 3, 4:
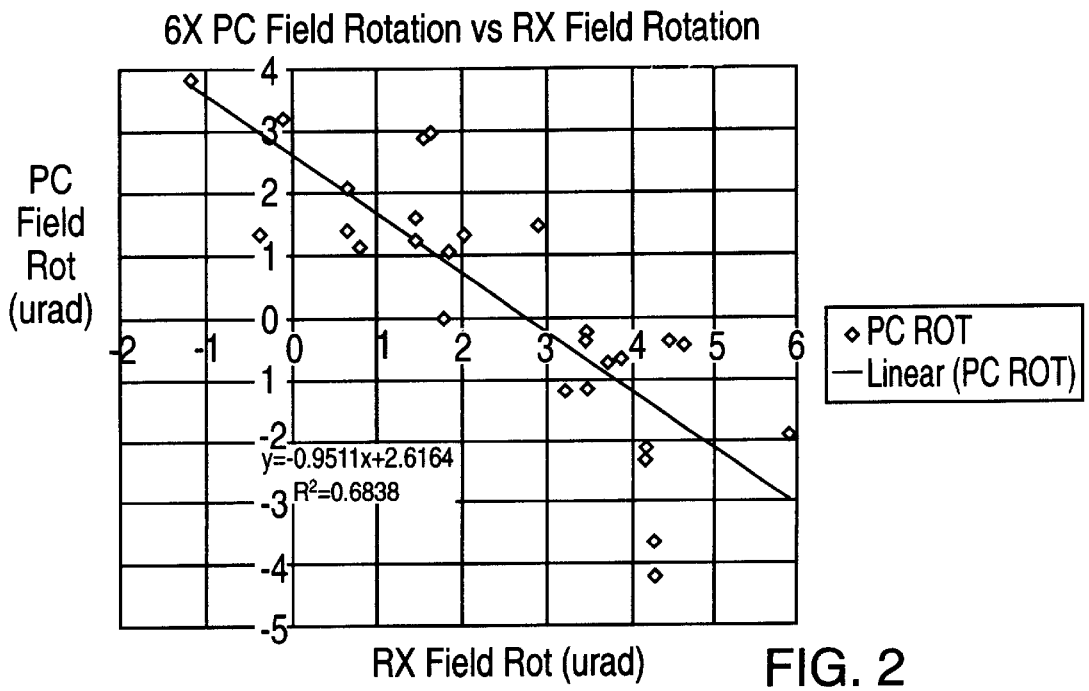
FIG. 2 shows a linear correlation among lithographic overlays of a first product lot.
FIG. 3 is a table giving data obtained from the first product lot.
FIG. 4 is a table providing data obtained from a second product lot.

This invention has been tested with two rounds of product, referred to herein as CMOS 1 and CMOS 2. Five CMOS 1 lots were overridden with projected (linear) correlations, shown in FIG. 2, and exposed over three days. As the data in FIG. 3 shows, about 3×improvement in field rotation errors was realized. This would result in approximately a 15–20 nm improvement in maximum error vector versus the current state of the art.

In the second round of product, six CMOS 2 lots were overridden with projected linear correlations, with projected linear correlations for field rotation and skew only, and exposed for over seven days. As the data in FIG. 4 shows, about a 4×improvement in field skew relative to current methods was achieved.

Figure 5:
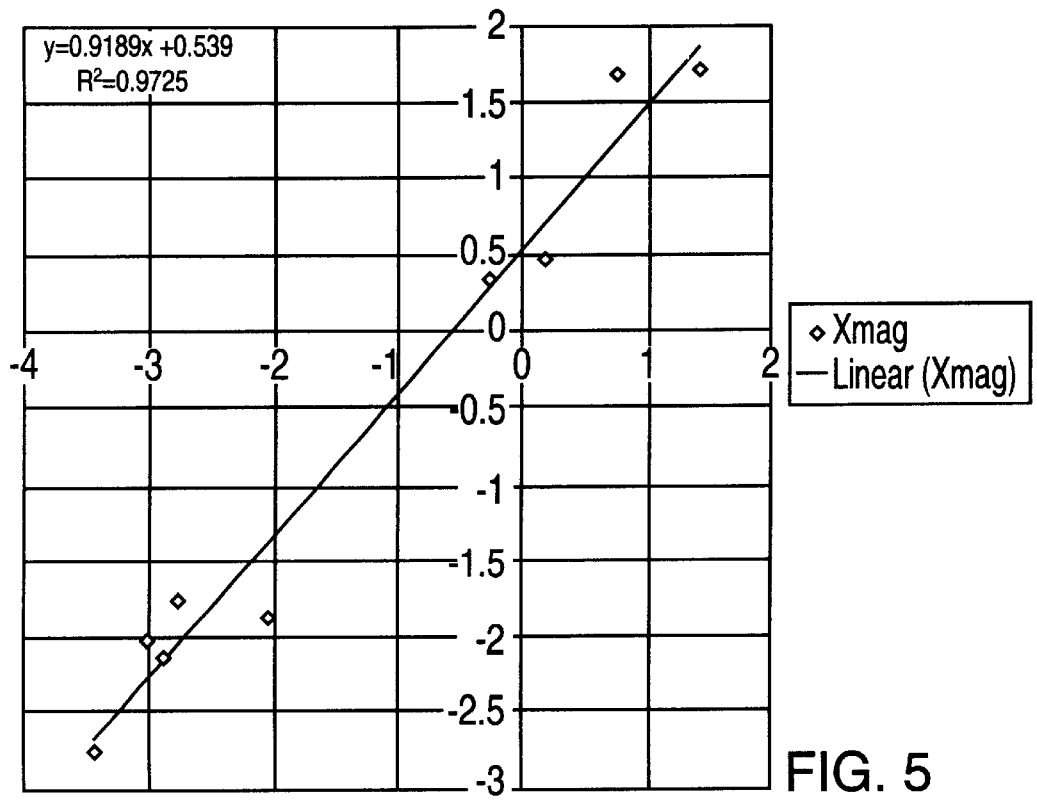
FIGS. 5 and 6 show correlations between two memory aligned lithography levels.
Figure 6:
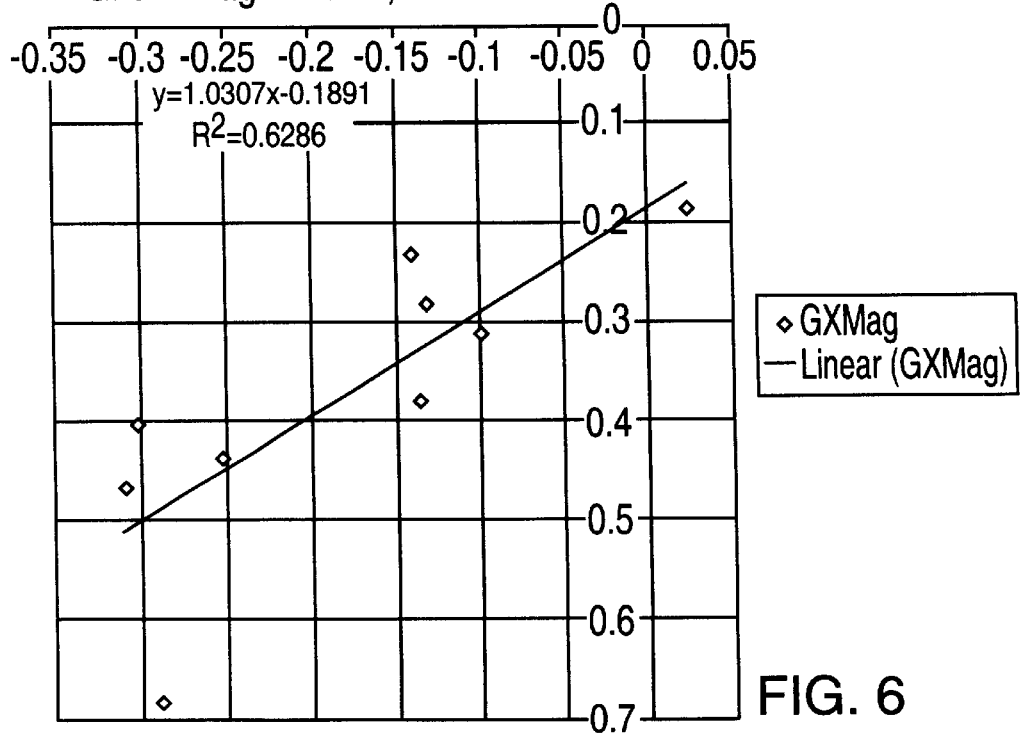

The above methods addressed field systematics, as the initial level was an unaligned RX level using field butting measurements to infer field systematics. Similar correlations have been successfully established, but not yet tested, between two memory aligned levels. Two examples are shown in FIGS. 5 and 6.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of predicting systematic lithographic overlay offsets, comprising the steps:
    creating a database of overlay systematics for each lot processed at a first lithographic level and second lithographic level by measuring overlay, and recording these systematic errors and the lot identification;
    creating a correlation between each overlay offset at the second lithographic level relative to the first lithographic level;
    for a new lot, measuring the overlay systematics at the first lithographic level; and
    using the correlation between the overlay offsets and the measured overlay systematics from the first lithographic level of the new lot to predict optimum overlay offsets at the second lithographic level of the new lot.

2. A method according to claim 1, wherein the step of creating the correlation includes the step of sorting the correlations according to given parameters.

3. A method according to claim 1, wherein the step of creating the correlation includes the step of creating the correlation using a linear regression technique.

4. A method according to claim 3, wherein a minimum r-squared value is required to utilize said correlation.

5. A method according to claim 3, wherein limits are placed on the derived linear slope, and correlations with said derived slope outside said limits are not utilized.

6. A method according to claim 3, wherein limits are placed on the derived linear y-intercept value, and correlations with said derived y-intercept outside said limits are not utilized.

7. A method according to claim 1, wherein statistical methods are used to remove anomalous data paints.

8. A method according to claim 1, wherein the step of creating the correlations includes the step of including tool setting data from multiple aligners, then using said correlation to predict offsets for an aligner for which no-data exists.

9. A method according to claim 1, wherein data from two aligners and multiple alignment levels can be used to predict offsets for one lithographic level on one of said aligners where no data from said level exists by:
    establishing a first correlation between lithographic level 1 and lithographic level 2 on a first aligner;
    establishing a second correlation between lithographic level 1 and lithographic level 2 on a second aligner;
    subtracting said first correlation from second correlation, creating a third correlation describing the difference between said first aligner and said second aligner;
    establishing a fourth correlation between lithographic level 3 and lithographic level 4 on a first aligner;
    adding said third difference correlation to said fourth correlation, thus creating a fifth correlation representing the anticipated correlation between said lithographic levels 3 and 4 on said second aligner; and
    using said fifth correlation to predict optimum overlay offsets of said levels 3 and 4 on said second aligner.

10. A system for predicting systematic lithographic overlay offsets, comprising:
    means for creating a database of overlay systematics for each lot processed at a first lithographic level and second lithographic level by measuring overlay, and recording these systematic errors and the lot identification;
    means far creating a correlation between each overlay offset at the second lithographic level relative to the first lithographic level;
    means for measuring, for a new lot, the overlay systematics at the first lithographic level; and
    means for using the correlation between the overlay offsets and the measured overlay systematics from the first lithographic level of the new lot to predict optimum overlay offsets at the second lithographic level of the new lot.

11. A system according to claim 10, wherein the means for creating the correlation includes means for sorting the correlations according to given parameters.

12. A system according to claim 10, wherein the means for creating the correlations includes means for including tool setting data from multiple aligners, and for then using said correlation to predict offsets for an aligner for which no-data exists.

13. A system according to claim 10, wherein valid correlations exist on multiple align tools, and the means for creating the correlation includes means for using the average of these valid correlations to predict behavior on a new tool at the second lithographic level.

14. A system according to claim 13, wherein the means for using includes:
    means for establishing a first correlation between lithographic level 1 and lithographic level 2 on a first aligner;

means for establishing a second correlation between lithographic level 1 and lithographic level 2 on a second aligner;

means for subtracting said first correlation from second correlation, creating a third correlation describing the difference between said first aligner and said second aligner;

means for establishing a fourth correlation between lithographic level 3 and lithographic level 4 on a first aligner;

means for adding said third difference correlation to said fourth correlation, thus creating a fifth correlation representing the anticipated correlation between said lithographic levels 3 and 4 on said second aligner; and means for using said fifth correlation to predict optimum overlay offsets of said levels 3 and 4 on said second aligner.

15. A method according to claim 10, wherein valid correlations exist for the second lithographic level to the first lithographic level on two tools, and a correlation exists for a fourth lithographic level to a third lithographic level on a first of the tools, and the means for creating the correlation includes means for using the difference between the two correlations on said first of the tools to predict the correlation of the fourth lithographic level to the third lithographic level on the second of the tools.

16. A program storage device readable by machine, tangibly embodying a program of instructions executable by the machine to perform method steps for predicting systematic lithographic overlay offsets, said method steps comprising:

creating a database of overlay systematics for each lot processed at a first lithographic level and second lithographic level by measuring overlay, and recording these systematic errors and the lot identification;

creating a correlation between each overlay offset at the second lithographic level relative to the first lithographic level;

for a new lot, measuring the overlay systematics at the first lithographic level; and using the correlation between the overlay offsets and the measured overlay systematics from the first lithographic level of the new lot to predict optimum overlay offsets at the second lithographic level of the new lot.

17. A program storage device according to claim 16, wherein the step of creating the correlation includes the step of sorting the correlations according to given parameters.

18. A program storage device according to claim 16, wherein the step of creating the correlation includes the step of creating the correlation using a linear regression technique.

19. A program storage device according to claim 16, wherein the step of creating the correlations includes the step of including tool setting data from multiple aligners, then using said correlation to predict offsets for an aligner for which no-data exists.

20. A program storage device according to claim 16, wherein data from two aligners and multiple alignment levels can be used to predict offsets for one lithographic level on one of said aligners where no data from said level exists by:

establishing a first correlation between lithographic level 1 and lithographic level 2 on a first aligner;

establishing a second correlation between lithographic level 1 and lithographic level 2 on a second aligner;

subtracting said first correlation from second correlation, creating a third correlation describing the difference between said first aligner and said second aligner;

establishing a fourth correlation between lithographic level 3 and lithographic level 4 on a first aligner;

adding said third difference correlation to said fourth correlation, thus creating a fifth correlation representing the anticipated correlation between said lithographic levels 3 and 4 on said second aligner; and using said fifth correlation to predict optimum overlay offsets of said levels 3 and 4 on said second aligner.

* * * * *